(12) United States Patent
Abrecht et al.

(10) Patent No.: US 11,011,350 B2
(45) Date of Patent: May 18, 2021

(54) VARIABLE POWER CAPACITOR FOR RF POWER APPLICATIONS

(71) Applicant: COMET AG, Flamatt (CH)

(72) Inventors: Mike Abrecht, Thorishaus (CH); Thomas Fink, Staufen (CH); Walter Bigler, Heitenried (CH)

(*) Notice: Subject to any disclaimer, the term of this patent is extended or adjusted under 35 U.S.C. 154(b) by 106 days.

(21) Appl. No.: 15/509,146

(22) PCT Filed: Sep. 4, 2014

(86) PCT No.: PCT/EP2014/068887
§ 371 (c)(1),
(2) Date: Mar. 6, 2017

(87) PCT Pub. No.: WO2016/034241
PCT Pub. Date: Mar. 10, 2016

(65) Prior Publication Data
US 2018/0233330 A1 Aug. 16, 2018

(51) Int. Cl.
*H01J 37/32* (2006.01)
*H01G 7/06* (2006.01)
*H03H 7/40* (2006.01)

(52) U.S. Cl.
CPC ........ *H01J 37/32183* (2013.01); *H01G 7/06* (2013.01); *H01J 37/32082* (2013.01); *H01J 37/32174* (2013.01); *H03H 7/40* (2013.01)

(58) Field of Classification Search
CPC ........ H01J 37/32183; H01J 37/32082; H01J 37/32174; H01G 7/06; H01G 5/011; H01G 5/16; H03H 7/40; H01Q 21/065; H01Q 3/44; H01Q 21/0031; H01Q 21/30; H01Q 3/2676; B81B 3/0086; B81B 2201/0221; B81B 2201/0271; B81B 2203/0127; B81B 2203/04; B81C 1/00158; B81C 2203/0118; H03J 3/02
(Continued)

(56) References Cited

U.S. PATENT DOCUMENTS 4,363,088 A 12/1982 Yamamoto
5,032,805 A 7/1991 Elmer
(Continued)

FOREIGN PATENT DOCUMENTS

CN 1596506 A 3/2005
CN 101180699 A 5/2008
(Continued)

OTHER PUBLICATIONS

Jae-Ho Jeon "Effect of SrTiO3 concentration and sintering temperature on microstructure and deelectric constant of Ba1-xSrxTiO3", Journal of the European Ceramic Society, vol. 24, issue 6, 2004, pp. 1045-1048, issn 0955-2219.

*Primary Examiner* — Michael P McFadden
(74) *Attorney, Agent, or Firm* — The Webb Law Firm (57) ABSTRACT

A power capacitor (7) is described for use in an RF power delivery system. The power capacitor comprises at least two RF electrodes (18, 19) separated by a capacitor dielectric (17) comprising a solid paraelectric dielectric material whose relative permittivity is controllable by varying a DC bias voltage applied across the dielectric (17) at DC bias electrodes (10, 26, 28). Composite capacitor configurations, an RF power system and a method of controlling the power capacitor are also described.

18 Claims, 6 Drawing Sheets

(58) Field of Classification Search
USPC .......................................................... 361/278
See application file for complete search history.

(56) References Cited

U.S. PATENT DOCUMENTS

| | | | |
|---|---|---|---|
| 7,910,510 B2 | 3/2011 | Paul | |
| 8,416,008 B2 | 4/2013 | Van Zyl | |
| 2006/0005928 A1* | 1/2006 | Howald | H03H 7/40 |
| | | | 156/345.48 |
| 2007/0242411 A1 | 10/2007 | Kanno | |
| 2008/0232023 A1* | 9/2008 | Oakes | H01G 7/06 |
| | | | 361/280 |
| 2009/0257167 A1* | 10/2009 | Kanno | H01G 7/06 |
| | | | 361/278 |
| 2009/0310275 A1* | 12/2009 | Katta | H01L 27/0808 |
| | | | 361/277 |
| 2010/0018648 A1* | 1/2010 | Collins | H01J 37/32082 |
| | | | 156/345.24 |
| 2010/0225411 A1 | 9/2010 | Maier | |

FOREIGN PATENT DOCUMENTS

| | | |
|---|---|---|
| CN | 103021774 A | 4/2013 |
| DE | 2752025 | 12/1978 |
| JP | S56103532 A | 8/1981 |
| JP | H1167592 A | 3/1999 |
| JP | 2009142043 A | 6/2009 |
| JP | 2011119482 A | 6/2011 |
| JP | 201269580 A | 4/2012 |
| WO | 2013061730 A1 | 5/2013 |

* cited by examiner

VARIABLE POWER CAPACITOR FOR RF POWER APPLICATIONS

FIELD OF THE INVENTION

The invention relates to the field of power capacitors suitable for use in radio frequency (RF) power applications such as, for example, dynamic impedance matching of RF power supplied to plasma systems. The invention also relates to a dielectric suitable for use in such power capacitors, and to methods of using such capacitors in RF power applications.

BACKGROUND OF THE INVENTION

RF power applications may comprise for example supplying RF power at high voltage and/or high current to a device such as a plasma chamber. Plasma chambers are used in industrial processes such as surface treatment of materials or plasma etching in semiconductor fabrication processes. The plasma is typically produced and maintained by an electric current alternating at an RF frequency, which excites and ionises the rarified source gas used in the plasma chamber. Alternatively, instead of using such a rarified gas, as is common in many industrial applications, radio-frequency plasma excitation for industrial applications is also possible at or above atmospheric pressure.

From the point of view of the RF power generator, the plasma chamber presents a load impedance which may vary greatly and quickly. It is important that the output impedance of the RF power generator be closely matched to the rapidly-changing load impedance of the plasma chamber, in order to avoid damaging reflections of power back into the output circuitry of the RF power generator, which can occur when the impedances are mismatched. Separate impedance matching devices (so-called "matchboxes") are commonly used which match the load impedance of the plasma chamber to the output impedance of the RF power generator. In the case of a rapidly-varying load impedance, the matchbox must be capable of dynamically matching the impedance accordingly. In other cases, in which the load impedance remains relatively constant, the matchbox is simply to provide a similarly constant impedance matching function.

Matchboxes comprise reactive components, such as capacitors, which must be capable of handling the high power (high voltage and/or high current) delivered via the matchbox to the load (eg plasma chamber). In the case of impedance matching, such high-power capacitors may be required to have a variable reactance (capacitance). Capacitance values of such capacitors may be, for example 50 pF to 1 nF or more, and the maximum speed of variation of such a variable capacitor may be a limiting factor for the speed of variation of the impedance matching provided by the matchbox.

RF power generators and other devices may also comprise such high-power reactive components, variable and/or fixed, for example in their output stages. The output impedance of commercial RF power generators is commonly standardised to 50 ohms. An adjustable capacitance integrated in the generator circuit could be used to stabilize very rapidly the output stage during a temporary impedance mismatch condition.

PRIOR ART

Vacuum variable capacitors (ie using vacuum as the dielectric) have been developed which are capable of handling high power and operating reliably over hundreds of thousands of duty cycles. Such capacitors typically comprise pairs of electrodes whose overlap area is varied by moving the electrodes relative to each other, usually by means of an electric motor and a mechanical drive mechanism. The tuning time (time taken for the capacitance to be changed from one value to another) may typically be of the order of 100 ms to several seconds, depending on the size and design of the capacitor and the magnitude of the change in capacitance. Such a vacuum variable capacitor is disclosed in German patent application DE2752025A1, for example. Vacuum variable capacitors are relatively bulky components, with dimensions of several centimeters or several tens of centimeters, for example. They are also relatively complex to manufacture, requiring a long-lasting, very high vacuum and precisely-machined electrode and drive components.

In order to offer faster tuning times, it has been proposed (see for example US20100225411) to implement a variable capacitance by employing fast-switching PIN diodes to switch between multiple fixed capacitors. It has also been proposed to use fast-switching bipolar junction transistor (BJT) or insulated gate bipolar transistors (IGBT), as disclosed for example in U.S. Pat. No. 8,416,008B2. Beside the requirement that such devices withstand large reverse-bias voltages, these switched-based adjustment arrangements suffer from a significant disadvantage in that they only allow a stepped (ie non-continuous) variation in the capacitance. In order to obtain a quasi-continuous variation, it would be possible to employ a very large number of switches. However, this would be bulky, costly and detrimental to long-term reliability, as the failure of any one of the many switches would render the entire device unusable.

It is known in unrelated technical fields, such as mobile communications systems operating in the GHz range, to use variable capacitors formed as a thin film (for example 70 nm thick) or a thick film (for example 30 μm thick) of a so-called paraelectrical dielectric material, whose relative permittivity varies with applied electric field. However, such capacitors are limited to low-power applications with RMS voltages up to a few tens of volts, and RMS currents of a few mA or less.

Since the later description concerns the use of paraelectric dielectric materials, the following brief introduction to the concept is included for reference. In contrast to their conducting (metallic) counterparts, insulating or dielectric materials do not allow free movement of electric charges through the material. However, positive and negative electric charges can be locally shifted so that local electric dipoles occur. In most materials, without any external applied electric field, these local dipoles are randomly oriented and macroscopically cancel themselves out. Therefore most materials are not macroscopically polarized. However, by applying an external electric field E, the dipoles will align in the direction of the applied field, with the effect that the resultant sum of the local dipoles will be an induced polarization P at the macroscopic level. This polarization is, in most dielectric materials, proportional to the applied electric field and the slope of P(E) is a constant. These materials are said to be linear dielectric materials. For other dielectrics, called non-linear dielectrics, the slope of P(E) is not a constant and changes with the magnitude of the applied field. These dielectrics are then sub-categorized as paraelectric materials, in which the effects of the induced polarisation revert to the initial state when the applied field is removed. In another subcategory of dielectrics, called ferroelectric materials (by analogy to ferromagnetic materials), the effect of the induced polarization persists even when the applied electric field is removed.

The polarizability of a material is expressed in its relative permittivity. The term "relative permittivity" is preferred in this description, since the alternative term "dielectric constant" suggests an invariant parameter, which is not correct when describing non-linear dielectric materials, whose relative permittivity may change with temperature, for example, or as the result of an applied electric field.

Note that references in this text to a dielectric refer to a physical entity, having a particular shape and size, and the term should not be confused with references to a dielectric material, which refers to the material generally.

Figure 1:
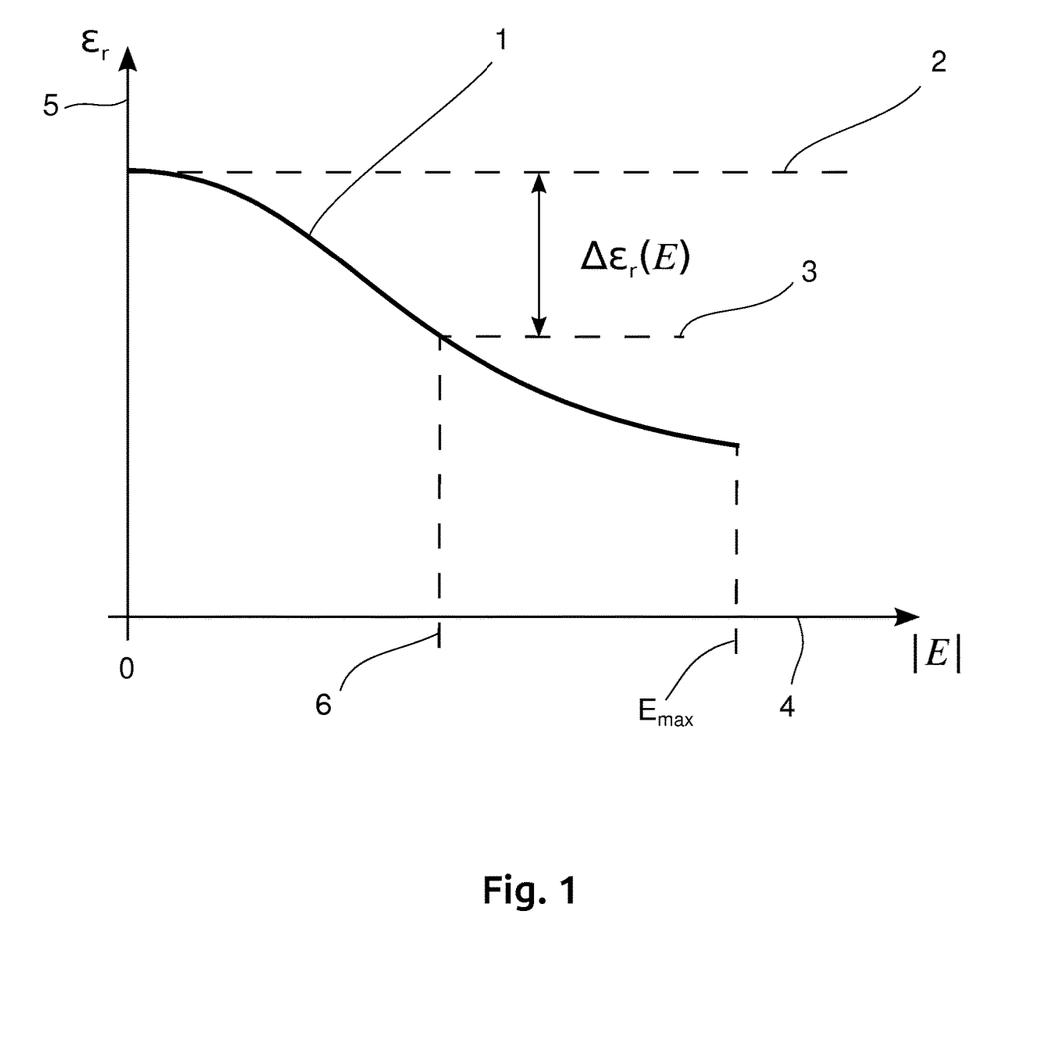
FIG. 1 depicts a graph of the relative permittivity $\varepsilon_r$ versus applied field |E| for an example of a dielectric according to the invention.

Relative permittivity is a scalar (or tensor for anisotropic materials) quantity, and is defined relative to the permittivity of a vacuum (by definition, the relative permittivity $\varepsilon_{r,v}$ of a vacuum is 1). Linear dielectrics have a field-independent relative permittivity, whereas non-linear dielectrics have a field-dependent relative permittivity $\varepsilon_r=\varepsilon_r(E)$. The curve 1 in FIG. 1 shows an example of how the relative permittivity of a paraelectric material may vary with applied electric field.

It is known in the prior art (see for example U.S. Pat. No. 7,910,510B2) that the ceramic compound $BaTiO_3$ is a ferroelectric material and that above its so-called Curie temperature of $T_C$=115° C., it becomes paraelectric. By substituting some of the Ba atoms with Sr, and by inserting other trace elements into its crystal structure, the properties of the material can be adjusted so that its Curie temperature is reduced to room temperature or below. This means that the material can be used in its paraelectric phase at room temperature. It also allows the relative permittivity $\varepsilon_r$ of the material to be raised to 2000 or more, and the tunability is also increased (this means that the relative permittivity $\varepsilon_r$ can be varied across a wide range of values by varying an applied electric field). See also the article by Jae-Ho Jeon, "Effect of $SrTiO_3$ Concentration and Sintering Temperature on Microstructure and Dielectric Constant of $Ba_{1-x}Sr_xTiO_3$", Journal of the European Ceramic Society, Volume 24, Issue 6, 2004, Pages 1045-1048, ISSN 0955-2219.

BRIEF DESCRIPTION OF THE INVENTION

The invention aims to overcome at least some of the above disadvantages of prior art power capacitors. The use of a dielectric having a variable relative permittivity enables extremely fast adjustment of the capacitance in RF power applications such as plasma chambers, as described above. The capacitance adjustment may also be made continuously, thereby avoiding the stepwise adjustment of the switching solution previously used for fast adjustment in RF power delivery applications. In addition, because the capacitor of the invention uses few components and no moving parts, it may be manufactured more simply than prior art capacitors for RF power applications. It may also be manufactured with much smaller dimensions for a given capacitance value.

The invention will be described in detail with reference to the attached drawings, in which.

It should be noted that the figures are provided merely as an aid to understanding the principles underlying the invention, and should not be taken as limiting the scope of protection sought. Where the same reference numbers are used in different figures, these are intended to indicate similar or equivalent features. It should not be assumed, however, that the use of different reference numbers is intended to indicate any particular degree of difference between the features to which they refer.

DETAILED DESCRIPTION OF THE INVENTION

As described above, a non-linear (eg ceramic) dielectric material may be used in its paraelectric phase to form an electrically-adjustable capacitive device. This adjustability may be used in a variable capacitor, for example, or in a capacitor which has a nominal fixed value but whose capacitance can be adjusted or trimmed to compensate for variations in temperature, for example. When describing the invention, the terms "variable", "adjustable" and "tunable" are used in this description to refer to the changing of the capacitance of a variable capacitor, or to the adjustment of the capacitance of an adjustable/trimmable fixed-value capacitor (ie a capacitor which has a nominally fixed capacitance value, but whose capacitance value may nevertheless be adjusted, for example to compensate for drift or temperature-dependency effects). The invention relates to variable capacitors (or adjustable fixed-value capacitors) for use in high-power RF applications, in which for example vacuum variable capacitors have hitherto been used, and they are therefore suitable for use in high power delivery systems used, for example, for powering RF plasma etching or coating processes in semiconductor manufacturing industries. Instead of a mechanical adjustment mechanism of the vacuum variable capacitance (whose speed is limited and inherently slow compared to load impedance variations in RF plasma processes), an electric DC bias voltage is used to generate an electric field in the capacitor dielectric.

In order to control the relative permittivity in such RF power applications, the magnitude of the applied DC bias voltage should advantageously be significantly greater than the amplitude of the RF application voltage (for example a factor of 10 greater), so that the effect of the RF voltage on the relative permittivity of the paraelectric dielectric can be neglected compared with the effect of the DC bias voltage. The relative permittivity can thus be controlled and adjusted by varying the DC voltage. The speed of reaction of the permittivity to the applied voltage is essentially instantaneous, since dipole orientations in materials react in nanoseconds or less.

The adjustment of the relative permittivity results directly in an adjustment of the capacitance of a device made with a paraelectric dielectric. The dielectric may be formed as a rectangular block or tablet, or as a disc, for example, with parallel planar conducting electrodes of area A on either side of the dielectric. In this simple geometry, the capacitance is given by $C=\varepsilon_0\varepsilon_r A/d$, where d is the dielectric thickness (distance between the electrodes), $\varepsilon_0$ is the permittivity of vacuum (a physical constant), and $\varepsilon_r$ is the field-dependent (now DC-bias-voltage-dependent) relative permittivity of the dielectric.

The term radio frequency (RF) may conventionally be used to describe frequencies of 3 kHz to 300 GHz. However, the capacitor, dielectric and method of the invention are intended for use in a frequency range which is used in RF power systems, typically between 400 KHz and 200 MHz.

References to power RF are intended to refer to applications in which the RF power output may be rated at 50 W or more, such as 100 W or more, or even 1000 W or more.

The term high voltage is used to refer to voltages in excess of 1000 $V_{RMS}$, in agreement with international standards such as IEC 60038. The term "high current" is used to refer to currents in excess of 1 $A_{RMS}$. By comparison, currents of 50 $mA_{RMS}$ are known to cause respiratory arrest and death in humans (see for example safety guidelines issued by the US Occupational Safety and Health Administration). A standardised RF frequency for use in industry is 13.56 MHz, for example, although other RF frequencies are also used, for example 400 KHz, 2 MHz, 27.12 MHz, 40.68 MHz, 60 MHz, 80 MHz, 100 MHz and 162 MHz.

FIG. 1 shows an example of how the relative permittivity $\varepsilon_r$ of a paraelectric dielectric material such as a $Ba_{1-x}Sr_xTiO_3$ type material may vary with applied electric field. Relative permittivity $\varepsilon_r$ is on the vertical axis 5, and the modulus of the applied field |E| is on the horizontal axis 4. The axes 4, 5 and the curve 1 are not necessarily to scale. The change in relative permittivity of the paraelectric dielectric material caused by the applied voltage is indicated in FIG. 1 by $\Delta\varepsilon_r(E)$, the difference between the relative permittivity values at 2, where no bias voltage is applied (E=0), and at 3, the relative permittivity value for the particular applied electric field 6.

The tunability of the paraelectric material may be represented by $\Gamma=(\varepsilon_r(0)-\varepsilon_r(E_{max}))/\varepsilon_r(0)$, or alternatively in terms of the DC bias voltage as $\Gamma=(\varepsilon_r(0)-\varepsilon_r(V_{max}))/\varepsilon_r(0)$. The tunability represents the theoretical usable range of relative permittivity over which the dielectric can be operated for a given $E_{max}$ (or $V_{max}$), which represent the maximum field strength (or voltage) which the dielectric can tolerate without breakdown occurring.

Tunability values of 70% or more may be achieved with paraelectric dielectric materials such as the $Ba_{1-x}Sr_xTiO_3$ type materials mentioned earlier. Using the parallel planar electrode capacitance formula above and the field dependency curve shown in FIG. 1, it can be seen that the capacitance value of a simple device with this paraelectric dielectric is highest when no field is present (ie no DC bias voltage), and lowest when the maximum field $E_{max}$ (or DC bias voltage $V_{max}$) is applied.

Figure 2:
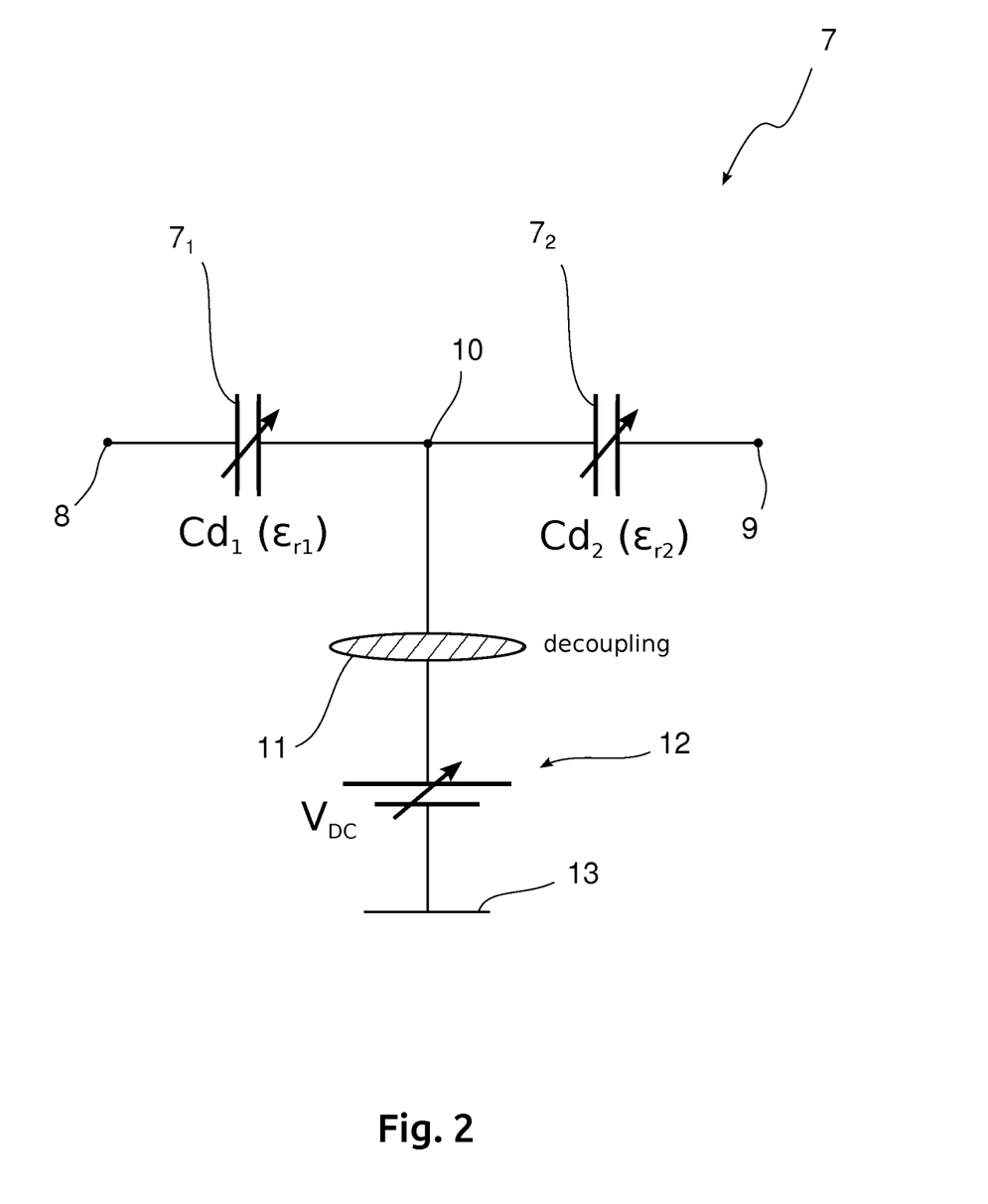
FIG. 2 shows a back-to-back connection arrangement of two capacitors, according to a variant of the invention in which the required electric field E is provided by an adjustable DC bias voltage supply.

FIG. 2 shows how two capacitances $7_1$ and $7_2$, both of which have voltage-tunable dielectrics, can be arranged back-to-back in series to provide a variable capacitor 7, whose capacitance can be varied (tuned) by varying the voltage $V_{DC}$ applied from a DC voltage supply 12, relative to a ground or reference potential 13, via a decoupling element 11 to the common circuit node 10 connecting the two capacitors $7_1$ and $7_2$. The two capacitors $7_1$ and $7_2$ may be formed from two blocks or tablets or discs of paraelectric ceramic material on either side of a (eg planar) DC bias electrode (represented by reference numeral 10 in the schematic of FIG. 2), and with two further (eg planar) RF electrodes, one of which is arranged on the opposite side of each of the blocks or tablets, connected as circuit nodes 8 and 9 of FIG. 2 respectively. The blocks or tablets or discs may be at least 0.1 mm thick, for example, or preferably at least 0.3 mm thick, or even more preferably at least 0.5 mm thick or even 1 mm thick or more. They may have a diameter or transverse dimension which is at least 3 mm, for example, or at least 5 mm or at least 10 mm or at least 20 mm, depending on the capacitance required, and on the required operating voltage. In view of the very high voltages and frequencies used in RF power systems, the electrodes and dielectrics may be enclosed in an appropriate insulating package.

The back-to-back series arrangement of the two capacitances $7_1$ and $7_2$ has the effect of reducing the combined capacitance (because capacitances in series have a resulting lower capacitance overall). However this is a small disadvantage when compared with the significant reduction in size which can be achieved compared with the previously-available vacuum variable capacitors with the same capacitance. The much greater relative permittivity of the paraelectric ceramic material makes it possible to achieve a given capacitance with a much smaller electrode area than is possible with a vacuum variable capacitor, and with a much smaller volume.

For example, a 1000 pF vacuum variable capacitor for 3 kV applications may be at least 10 cm×10 cm×10 cm in size, excluding the required motorized drive mechanism, which is similar size again, or even larger. By contrast, the package of a variable dielectric capacitor of 1000 pF using a paraelectric dielectric material and the electric fast tuning (variable DC bias voltage) may be 2 cm×2 cm×4 cm or even smaller, for example. The device volume may thus be reduced by a factor of more than 100.

Figure 3:
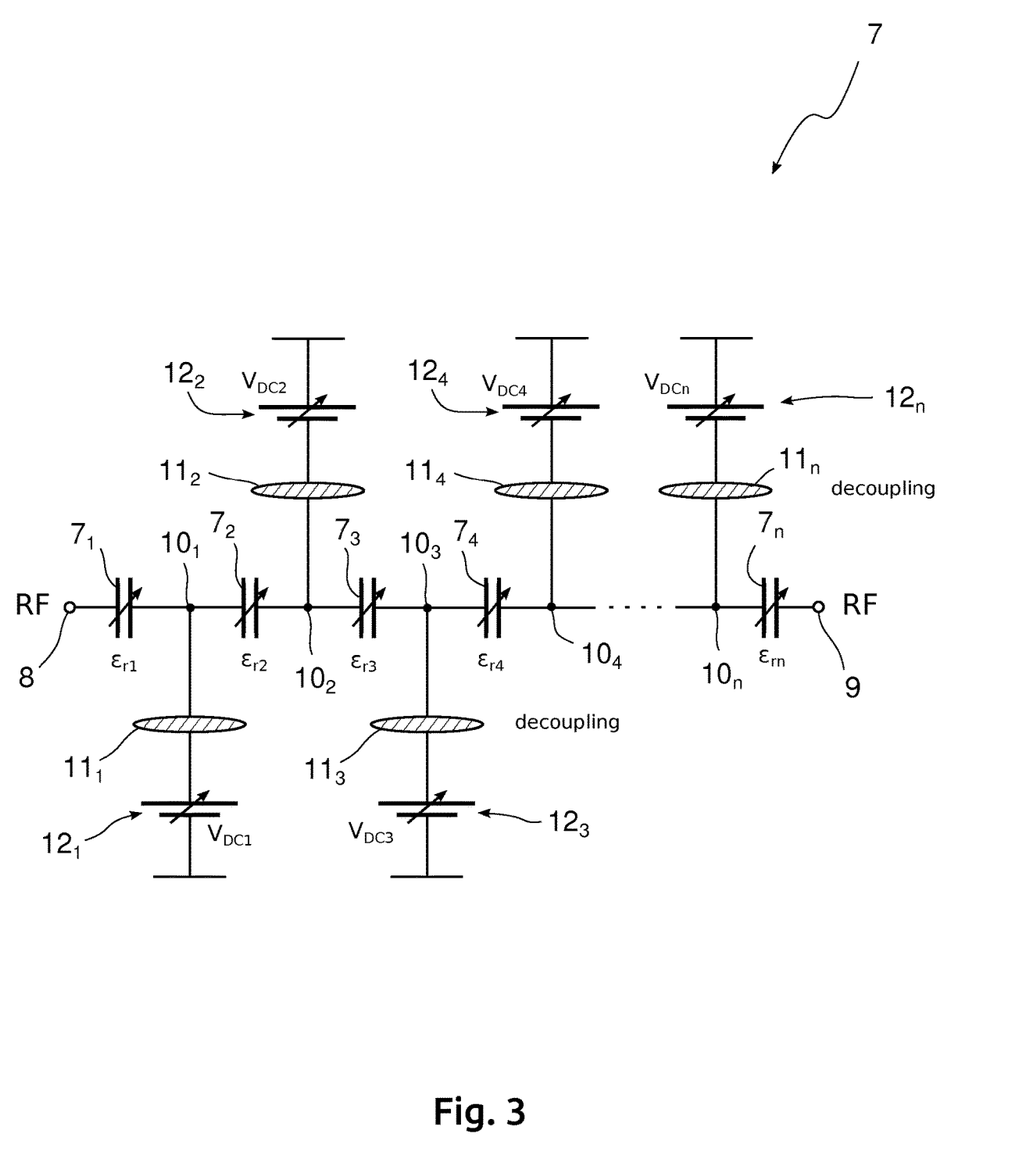
FIG. 3 shows a schematic of a stack arrangement of multiple capacitors according to the invention.

FIG. 3 shows a stacked arrangement of the variable-dielectric capacitors $7_1$, $7_2$, $7_3$ . . . $7_n$ similar to those described above. Such an array may advantageously be used in high power applications in semiconductor manufacturing industries, in which very high voltages are used. In order to allow high voltage applications without exceeding the maximum field strength $E_{max}$ discussed earlier, the stacked arrangement comprises n (where n>2) tunable-dielectric capacitors, connected in series as shown in FIG. 3. The resulting voltage across each dielectric block or tablet or disc is then only a fraction of the full voltage across the terminal contacts 8 and 9 of the composite capacitor. If all of the dielectrics (blocks or tablets or discs, for example) are substantially identical, then connecting n in series will result in the individual RF voltages being diminished by a factor n compared to the RF application voltage across terminals 8 and 9. As a consequence, the successive DC biasing voltages $V_{DC1}$, $V_{DC2}$, $V_{DC3}$ . . . $V_{DCn}$, required at nodes $10_1$, $10_2$, $10_3$ . . . $10_n$, are reduced by the same factor.

The stack arrangement shown in FIG. 3 may advantageously comprise a cooling system for evacuating heat generated in the stack due to dielectric losses or when operated at high currents. Such a system may for example comprise a heatsink in good thermal contact with the heat generating dielectric parts, air cooling with fans, and/or one or more heat-pipes. The stack of dielectric blocks, tablets or discs can be insulated to withstand high voltages. The limitation of voltage breakdown may not occur inside the dielectric but on the outside (in air) or between the DC bias voltage feed connectors. The stacked composite capacitor shown in FIG. 3 can therefore further be optimized to include insulating or other preventative measures to avoid voltage breakdown outside the structure of the capacitor.

As indicated in FIG. 3, the alternate DC bias nodes $10_1$, $10_2$, $10_3$ etc may be supplied by DC voltages of alternating opposite polarities, $12_1$, $12_2$, $12_3$ etc. In this way, the range of the DC bias voltage across each individual capacitor $7_1$, $7_2$ etc is twice that applied at each individual DC bias node. Doubling the DC bias voltage range across each capacitor also helps to increase the tunability of the individual capacitors.

Figure 4:
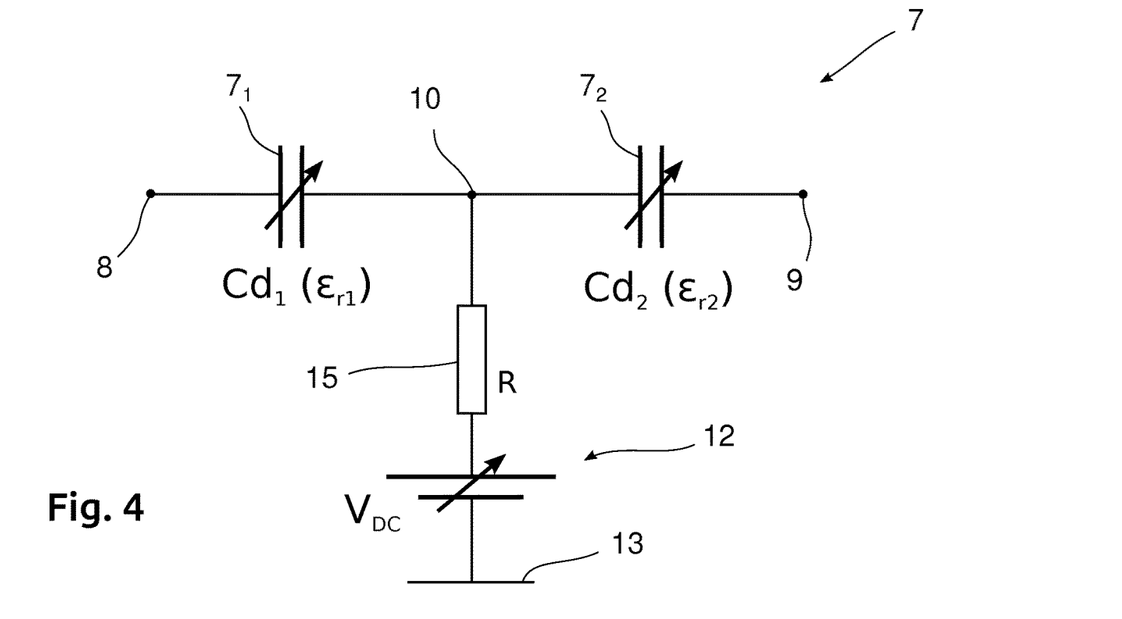
FIG. 4 shows a schematic of a resistive decoupling arrangement for the DC bias voltage supply of the back-to-back connection arrangement of FIG. 2.

As mentioned earlier, in order for the RF power signal not to interfere with the DC bias voltage, a decoupling mechanism may advantageously be used. FIG. 4 shows a resistive decoupling element 15. A high resistance value R may be chosen, because only a voltage is required to adjust the material permittivity: no current is needed. However, it has been found that a resistance which is too high may slow down the capacitance adjustment process, so the resistance value R of the resistive decoupling should be chosen according to the desired adjustment speed.

Figure 5:
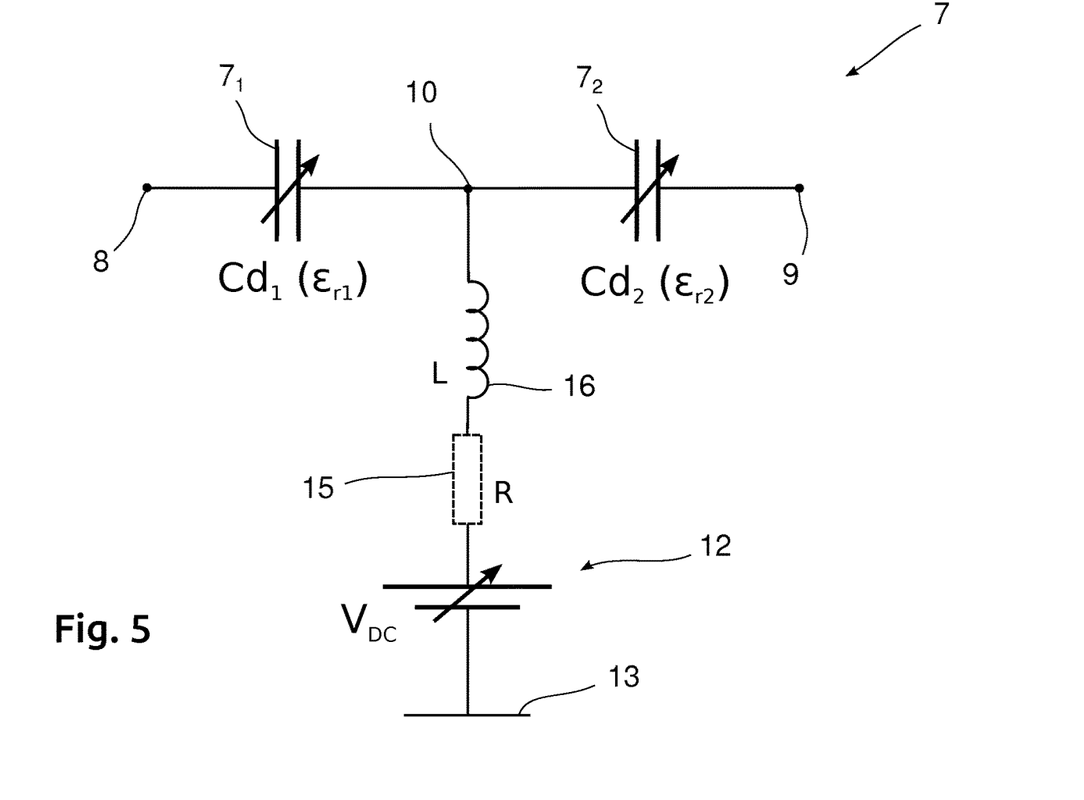
FIG. 5 shows a schematic of an inductive decoupling arrangement for the DC bias voltage supply of the back-to-back connection arrangement of FIG. 2.

FIG. 5 shows another decoupling arrangement, using an inductive decoupling element 16, optionally with a resistive decoupling component 15 in series. The inductive decoupling allows a faster tuning of the device than when using only resistive decoupling with high resistance. Other suitable elements (such as filter circuits) may also be used as decoupling mechanisms.

Figure 6:
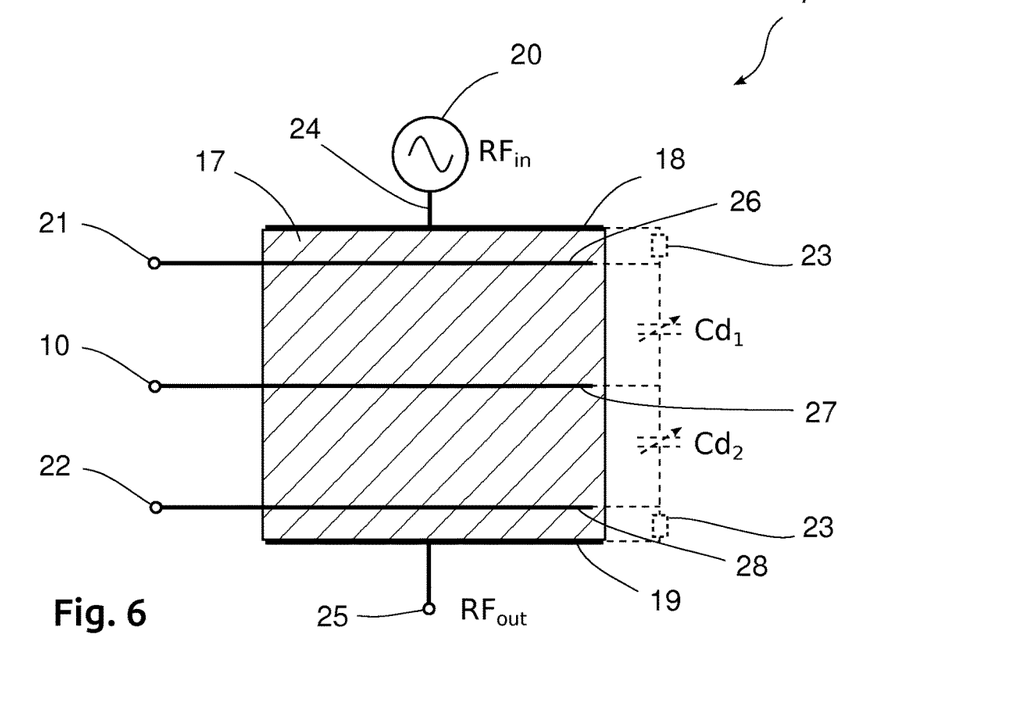
FIG. 6 shows a schematic cross-sectional view of an integrated block implementation of two capacitors according to a variant of the invention.
Figure 7:
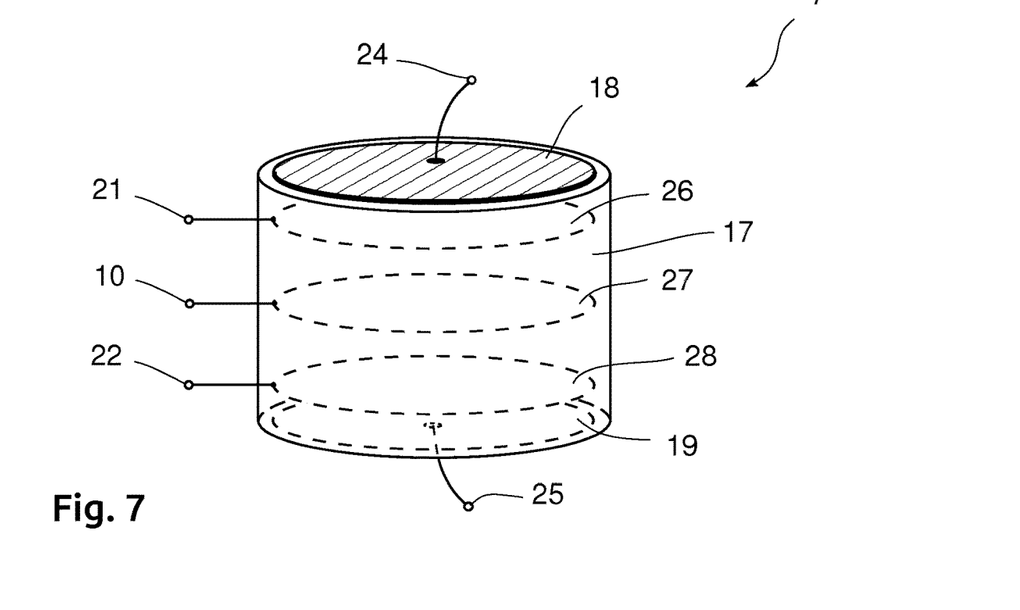
FIG. 7 shows a schematic isometric view of the integrated block implementation of FIG. 6.

FIGS. 6 and 7 show an example of an integrated block implementation of a tunable-dielectric capacitor according to the invention. In the illustrated example, five separate electrodes, 18, 26, 27, 28, 19 are used, three of which, 26, 27, 28, are integrated within a solid block 17 of the paraelectric dielectric material. This may be achieved, for example, by sintering a volume of the dielectric material with conductive connector implants (eg copper plates) already in position in the dielectric material. Since the sintering process may involve heating the material (eg a ceramic powder, such as a $Ba_{1-x}Sr_xTiO_3$ type material) to a high temperature in an oxygen-rich atmosphere, other conductive materials, which are not easily oxidised, may be used for the embedded electrodes 26, 27, 28, such as palladium, gold, tantalum, titanium, platinum or stainless steel, for example. Alternatively, or additionally, electrodes may be made from a conductive material such as a metal, and prepared (eg coated) with a flux and/or solder or brazing-type material which will, during the sintering process, or in a subsequent step, bond with the sintered ceramic material to form a good electrical contact between the embedded electrode(s) and the surrounding sintered paraelectric ceramic material. It is especially important in high power applications to achieve a good metallic-dielectric bonding in order to obtain a well-defined capacitance and low losses in operation (high Q values). The RF electrodes may be formed by sputtering, vapour deposition, or screen-printing the electrode material on to the surface of the paraelectric ceramic material. Suitable electrode materials include silver, silver-palladium, silver-containing pastes, molybdenum, molybdenum-manganese, nickel, titanium. In order to improve the metal-dielectric bond, the surface of the ceramic may advantageously undergo a surface preparation treatment such as a mechanical and/or chemical polishing process, plasma or laser treatment, ion implantation and/or deposition of a thin wetting layer or an intersticial surface layer of a dielectric material such as a different ceramic material or a glass, or of a conductive material such as one of those listed above.

In the illustrative example of FIGS. 6 and 7, two capacitors are formed by the five electrodes 18, 26, 27, 28, 19 and the dielectric 17. Capacitor $Cd_1$ is formed between RF electrode 18 and common DC bias electrode 27, and capacitor $Cd_2$ is formed between RF electrode 19 and the common DC bias electrode 27. Further DC bias electrodes 26 and 28 are provided for applying the DC bias voltage to the paraelectric dielectric 17, or at least to the part of the paraelectric dielectric 17 which lies between DC bias electrodes 26 and 27, and between DC bias electrodes 27 and 28. The part of the paraelectric dielectric 17 which lies between DC bias electrode 26 and RF electrode 18, and the part of the paraelectric dielectric which lies between DC bias electrode 28 and RF electrode 19, may serve as resistive decoupling elements as discussed with reference to FIG. 4. Because of the inherent high resistivity of the paraelectric dielectric 17 (eg $10^9$ Ω cm for a $Ba_{1-x}Sr_xTiO_3$ type material), these portions of the paraelectric dielectric 17 may be used as the resistive decoupling element 15 of FIG. 4. The spacing between the RF electrodes 18, 19 and the respective DC bias voltage electrodes 26, 28 may be chosen depending on the decoupling requirements. However, in order to maximise the tunability of the capacitor, the spacing of the decoupling portion should be kept to a minimum, since only the volume of the dielectric material between the DC bias connectors 26 and 28 can be used for adjusting the relative permittivity, and hence the capacitance value of the back-to-back composite capacitor 7.

FIGS. 6 and 7 show three electrodes embedded in the (eg sintered) paraelectric dielectric material. However, all five of the illustrated electrodes 18, 26, 27, 28 and 19 may alternatively be embedded in the dielectric 17, thereby reducing the amount of insulation required for the device.

In the example capacitor of FIGS. 6 and 7, the DC bias electrodes 26 and 28 are formed separately from the RF electrodes 18 and 19 respectively. However, the DC bias electrode 26 and the RF electrode 24 may alternatively be formed as one electrode (either embedded or not embedded in the dielectric 17), and the DC bias electrode 28 and the RF electrode 19 may be formed as one electrode (either embedded or not embedded in the dielectric 17), in which case a back-to-back capacitor arrangement as illustrated in FIG. 2, without an integrated decoupling element, would be formed, having two RF connections 8, 9 and one DC bias connection 10.

The stacked arrangement described with reference to FIG. 3 may also be fabricated such that the electrodes of some or all of the multiple series-connected capacitors $7_1$, $7_2$, $7_3$ ... $7_n$ are incorporated by embedding into a single solid dielectric block 17.

Embedding some or all of the electrodes into the paraelectric dielectric 17, for example during sintering of a ceramic dielectric material such as a $Ba_{1-x}Sr_xTiO_3$ type material, has the advantage that the capacitor 7 can be made essentially in one step (no subsequent modification of the connectors are required), and, in the case illustrated in FIGS. 6 and 7, no external decoupling mechanism is required, as part of the dielectric 17 itself is used as the decoupling element 15.

Figure 8:
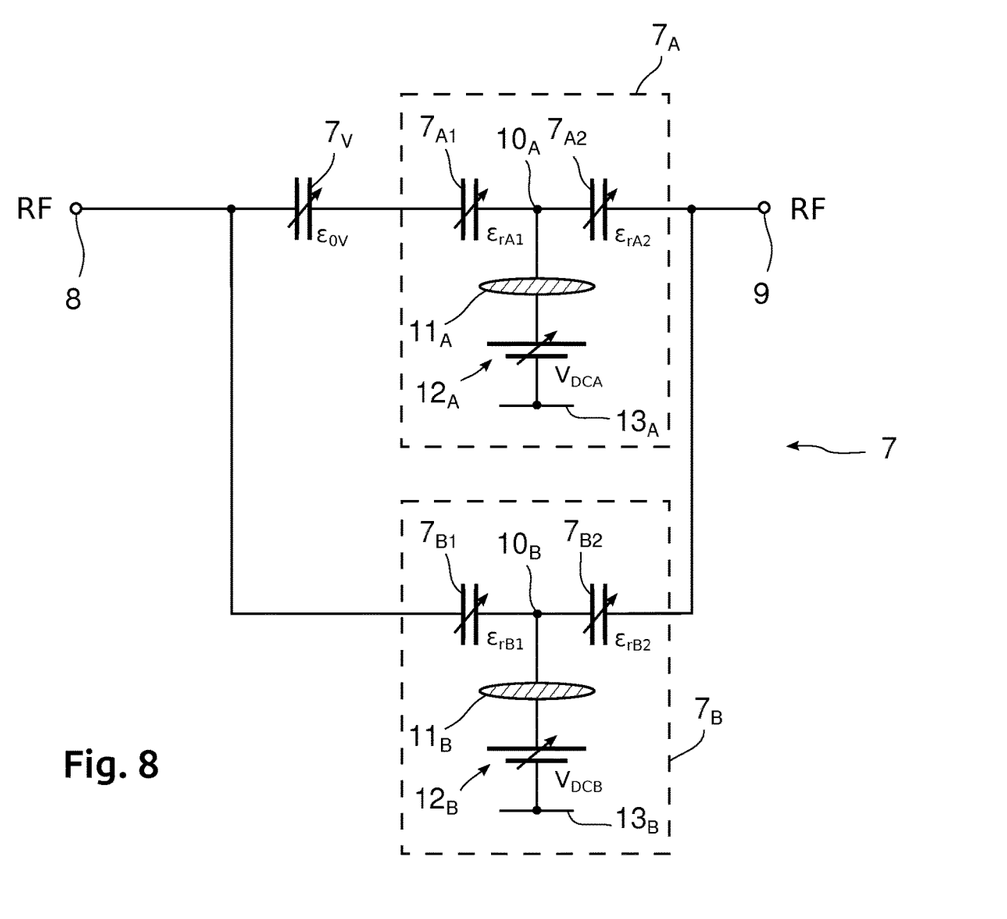
FIG. 8 shows a schematic of a hybrid configuration of capacitors according to a variant of the invention.

FIG. 8 shows a second composite capacitor configuration, in which fast adjustable-dielectric capacitors are used in combination with a slower adjustable capacitor such as a vacuum capacitor (capable of handling very high RF power). The configuration in FIG. 8 shows one variable vacuum capacitor $7_V$ combined with two composite adjustable-dielectric variable capacitors $7_A$, $7_B$ as described in relation to FIGS. 2, 4 and 5. The vacuum variable capacitor $7_V$ in this example is connected in series with one of the composite adjustable-dielectric variable capacitors $7_A$, and this series connected circuit is itself connected in parallel with a second composite adjustable-dielectric variable capacitors $7_B$. Such a configuration may be used in order to overcome the problem that adjustable-dielectric capacitors have a tunability which is limited (eg to about 70%). The vacuum variable capacitor $7_V$ has a much larger tunability (which may exceed 99%), and the configuration thus be used to provide a composite capacitor which provides: a large capacitance (thanks to the parallel combination of two composite capacitors $7_A$ and $7_V/7_B$), fast tuning (thanks to the presence of adjustable-dielectric capacitors $7_A$ and $7_B$) and a large tunability (thanks to the presence of the vacuum capacitor $7_V$). Other configurations of vacuum variable capacitors, fixed capacitors, switched capacitors, and/or variable or fixed dielectric capacitors can be used to achieve a similar effect.

The composite variable capacitor device shown in FIG. 8 is thus tunable with the speed of the dielectric polarization response and yet benefits from an extended tunability and an improved power compatibility thanks to the combination of vacuum and dielectric capacitors according to the invention. The configuration shows a device capable of a tunability of 90%, therefore exceeding the tunability of a paraelectric device alone.

If the composite capacitor of FIG. 8 is to achieve a capacitance range of 100 pF to 1000 pF (and thus a tunability of 90%), for example, the following values could be used for the various components:

vacuum variable capacitor $7_V$: 70 pF-3600 pF;

adjustable-dielectric capacitors $7_{A1}$ and $7_{A2}$: 1250 pF to 2500 pF adjustable-dielectric capacitors $7_{B1}$ and $7_{B2}$: 75 pF to 150 pF Such a configuration would give an overall capacitance range of the circuit which is variable from 100 pF to 1000 pF, with larger changes being achievable at a slower speed (the speed of the vacuum variable capacitor $7_V$), but with smaller changes being achievable at the much faster speed of the adjustable-dielectric capacitors $7_{A1}$, $7_{A2}$, $7_{B1}$ and $7_{B2}$ by varying DC bias voltage $V_{DC1}$ and/or $V_{DC2}$.

Figure 9:
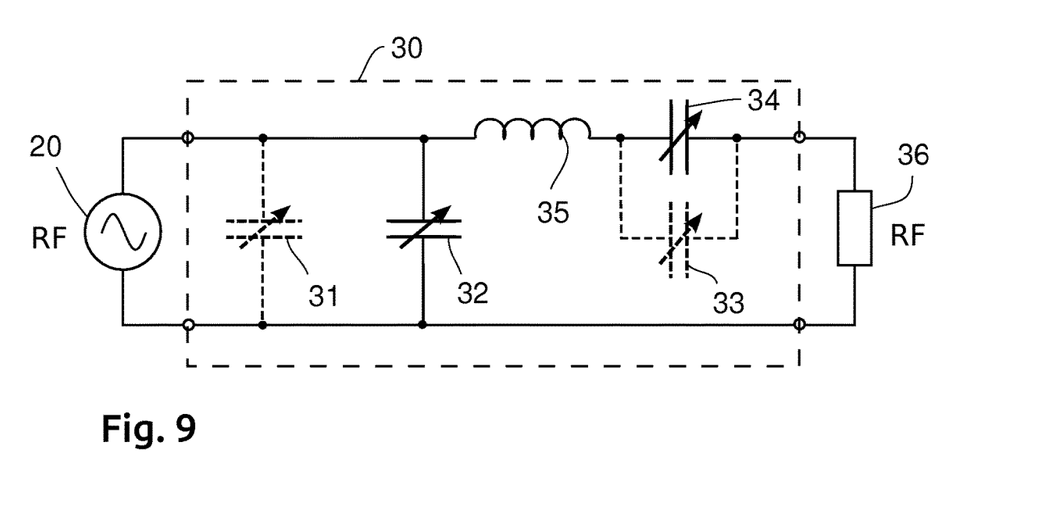
FIG. 9 shows a schematic of an example impedance matching network using a capacitor according to the present invention.

FIG. 9 shows a configuration of capacitors which may be used in an impedance matching circuit (in this example a so-called "L" topology) to match the impedance of an RF load 36 (such as that of a plasma etching or coating process) to that of an RF generator 20. The industry standard RF generator output impedance is 50 ohm. The configuration shows how an adjustable-dielectric variable capacitor 32, 33 can be used instead of, or in addition to, vacuum variable capacitors 31, 34. The example configuration of an impedance matching circuit shows the use of variable capacitors, however fixed capacitors can be used where appropriate, for example fixed vacuum capacitors and variable-dielectric capacitors or composite capacitors as described above. Other combinations of components are possible, such as the n topology and the T topology. Variable-dielectric capacitors may be used in such a matchbox circuit in a shunt configuration, as indicated by reference 32, and/or as a series-connected capacitor, as indicated by reference 33. Variable-dielectric capacitors 32, 33 may be used instead of, or in addition to, vacuum variable capacitors 31, 34.

Due to the much smaller size of the variable-dielectric capacitor devices 32, 33, an impedance matching network made only with those devices is small enough to be integrated directly into the output circuit of the RF power generator 20, instead of being implemented as a separate or external matchbox unit, as is the case in currently available RF power delivery systems used for industrial plasma processes. Whereas a matchbox unit employing vacuum variable capacitors may occupy a volume as large as 30,000 cm³, the volume of a similar unit employing variable-dielectric capacitors as described above may occupy as little as 100 cm³. A volume reduction of a factor of 300 is thus attainable.

We claim:

1. A power capacitor comprising at least two RF electrodes separated by a capacitor dielectric comprising a solid dielectric material, wherein the power capacitor is configured to operate in an RF power application at at least 50 watts, and wherein the solid dielectric material has a controllable relative permittivity, wherein the capacitor dielectric comprises a block of the solid dielectric material having a thickness of at least 0.1 mm, and wherein the solid dielectric material comprises a paraelectric ceramic material being a monolithic sintered block.

2. The power capacitor of claim 1, wherein the relative permittivity of the capacitor dielectric is controllable by varying a DC bias voltage applied across at least a portion of the capacitor dielectric.

3. The power capacitor of claim 1, wherein the capacitor dielectric comprises at least two DC bias electrodes, and wherein the relative permittivity is controllable by varying a DC bias voltage applied across the DC bias electrodes.

4. The power capacitor of claim 3, wherein at least one of the DC bias electrodes is formed as one of the RF electrodes of the power capacitor.

5. The power capacitor of claim 3, wherein at least one of the RF electrodes and/or at least one of the DC bias electrodes is substantially enclosed within the capacitor dielectric.

6. The power capacitor of claim 1, wherein the block of the solid dielectric material has a thickness of at least 0.3 mm.

7. The power capacitor of claim 1, wherein the paraelectric ceramic material comprises a barium strontium titanate.

8. The power capacitor of claim 1, wherein the capacitor dielectric is joined to at least one of the RF electrodes and/or to a conductive pad or track of a substrate or circuit board by a weld, a solder joint, or a braze joint.

9. A first composite capacitor comprising a first power capacitor according to claim 1, and a second power capacitor according to claim 1, wherein the first power capacitor and the second power capacitor are arranged to share a common permittivity control voltage node for connecting to a variable DC bias voltage source for varying tunable relative permittivities of the respective capacitor dielectrics of the first power capacitor and the second power capacitor.

10. The first composite capacitor of claim 9, further comprising at least one decoupling element configured to decouple the DC bias voltage source from an RF voltage at the common permittivity control voltage node and/or from an RF voltage at at least one of the RF electrodes.

11. The first composite capacitor of claim 10, wherein the at least one decoupling element comprises a resistive part of the capacitor dielectric.

12. A second composite capacitor comprising three or more power capacitors according to claim 1, connected in series, wherein:

each successive one of the series-connected power capacitors is connected to the next at a DC bias node, and each of the DC bias nodes is arranged for connection to a DC bias voltage for biasing the capacitor dielectrics of the said each and next power capacitors.

13. The second composite capacitor of claim 12, wherein alternate DC bias nodes are arranged for connection to DC bias voltages of alternately opposite polarity.

14. A reactance circuit comprising:
one or more third power capacitors according to claim 1, one or more first composite capacitors, and/or one or more second composite capacitors and
a fourth power capacitor,
wherein the one or more third power capacitors and/or the one or more first and/or second composite capacitors have a capacitance which is adjustable at a first adjustment speed, and the fourth power capacitor is adjustable at a second adjustment speed, the second adjustment speed being slower than the first adjustment speed.

15. The reactance circuit of claim 14, wherein the fourth power capacitor comprises a vacuum variable capacitor.

16. An RF power system configured to deliver at least 50 watts of RF power to an RF load, the RF power system comprising:
one or more first composite capacitors, each composite capacitor comprising a first power capacitor according to claim 1, and a second power capacitor according to claim 1, wherein the first power capacitor and the second power capacitor are arranged to share a common permittivity control voltage node for connecting to a variable DC bias voltage source for varying tunable relative permittivities of the respective capacitor dielectrics of the first power capacitor and the second power capacitor;
one or more second composite capacitors comprising three or more power capacitors according to claim 1, connected in series, wherein:
each successive one of the series-connected power capacitors is connected to the next at a DC bias node, and
each of the DC bias nodes is arranged for connection to a DC bias voltage for biasing the capacitor dielectrics of the said each and next power capacitors; and/or
a reactance circuit comprising:
one or more third power capacitors according to claim 1, one or more first composite capacitors, and/or one or more second composite capacitors; and
a fourth power capacitor,
wherein the one or more third power capacitors and/or the one or more first and/or second composite capacitors have a capacitance which is adjustable at a first adjustment speed, and the fourth power capacitor is adjustable at a second adjustment speed, the second adjustment speed being slower than the first adjustment speed.

17. The RF power system of claim 16, wherein the RF power system further comprises an RF power generator, an impedance matching circuit and/or a plasma control circuit of a plasma chamber.

18. A method, comprising:
providing a power capacitor comprising at least two RF electrodes separated by a capacitor dielectric comprising a solid dielectric material, wherein the power capacitor is configured to operate in an RF power application at at least 50 watts, and wherein the solid dielectric material has a controllable relative permittivity, wherein the capacitor dielectric comprises a block of the solid dielectric material having a thickness of at least 0.1 mm, and wherein the solid dielectric material comprises a paraelectric ceramic material being a monolithic sintered block; and
of varying a permittivity control voltage applied across the capacitor dielectric of the power capacitor.

\* \* \* \* \*